US 6,711,069 B2

(12) United States Patent
Lienau

(10) Patent No.: US 6,711,069 B2
(45) Date of Patent: Mar. 23, 2004

(54) REGISTER HAVING A FERROMAGNETIC MEMORY CELLS

(76) Inventor: Richard M. Lienau, HC 70, Box 19Z, Pecos, NM (US) 87552

( * ) Notice: Subject to any disclaimer, the term of this patent is extended or adjusted under 35 U.S.C. 154(b) by 0 days.

(21) Appl. No.: 10/239,127
(22) PCT Filed: Jan. 20, 2001
(86) PCT No.: PCT/US01/01792
§ 371 (c)(1), (2), (4) Date: Sep. 19, 2002
(87) PCT Pub. No.: WO01/54279
PCT Pub. Date: Jul. 26, 2001

(65) Prior Publication Data
US 2003/0223264 A1 Dec. 4, 2003

Related U.S. Application Data
(60) Provisional application No. 60/177,531, filed on Jan. 21, 2000.

(51) Int. Cl.[7] .............................................. G11C 16/04
(52) U.S. Cl. .................. 365/189.05; 365/205; 365/154; 365/145
(58) Field of Search ........................... 365/189.05, 205, 365/154, 145

(56) References Cited

U.S. PATENT DOCUMENTS

| 4,791,604 A | 12/1988 | Lienau et al. |
| 5,295,097 A | 3/1994 | Lienau |
| 6,134,173 A * | 10/2000 | Cliff et al. .............. 365/230.03 |
| 6,140,139 A | 10/2000 | Lienau et al. |
| 6,229,729 B1 | 5/2001 | Lienau |
| 6,266,267 B1 | 7/2001 | Lienau |
| 6,288,929 B1 | 9/2001 | Lienau |
| 6,317,354 B1 | 11/2001 | Lienau |
| 6,330,183 B1 | 12/2001 | Lienau |
| 6,341,080 B1 | 1/2002 | Lienau et al. |

OTHER PUBLICATIONS

WO 01/54133 A1, Lienau, Richard M., A Programmable array logic circuit macrocell using ferromagnetic memory cells, Jul. 26, 2001.*
WO 01/54280 A1, Lienau, Richard M., Programmable array logic circuit employing non–volatile ferromagnetic memory cells, Jul. 26, 2001.*

* cited by examiner

Primary Examiner—Michael S. Lebentritt
Assistant Examiner—Toan Le
(74) Attorney, Agent, or Firm—Jones, Waldo, Holbrook & McDonough; Brent T. Winder

(57) ABSTRACT

The invention generally related to registers or flip-flop circuits. More particularly, the present invention refers to the use of non-volatile ferromagnetic memory cell to store binary data in a register or flip-flop circuit. It is an advantage of the invention to have a flip-flop with a ferromagnetic memory cell or bit to store data even when there is no power provided to the circuitry. Thus, saving power during operation of any associated circuitry, and ensuring that there is no loss of the data should there be a temporary power shut down. Additionally, the ferromagnetic cells provide for indefinite number of switching actions on the data without degradation to the capacity to store data therein, or eliminating "write fatigue". The invention provides a latching circuit, comprising an input line entering the latching circuit for receiving a signal, an output line, electrically coupled to the input line, for outputting the signal, and a ferromagnetic bit and sensor coupled between the input line and the output line, to store a form of the signal in the ferromagnetic bit even when power has been suspended to the latching circuit.

16 Claims, 2 Drawing Sheets

REGISTER HAVING A FERROMAGNETIC MEMORY CELLS

This application claims benefit of Provisional Application Ser. No. 60/177,531 filed Jan. 21, 2000.

BACKGROUND OF THE INVENTION

1. The Field of the Invention

The present invention relates generally to registers or flip-flop circuits. More particularly, the present invention refers to the use of non-volatile ferromagnetic memory cell to store binary data in a register or flip-flop circuit.

2. The Background Art

Standard Latches or registers, also know as flip-flops have existed for many years. Up to the present, traditional PALs (programmable array logics) have used flip-flops for product registers and in their macrocells because of their ability to store a data bit. Lately, however, some fabricators have begun using EEPROM and Flash technology to replace these because of their ability to store the data bit even when the power has been turned off to the circuitry. These last two technologies, however, have draw-backs. EEPROMs are cumbersome to re-program, both are slow to re-program, exhibit "write fatigue," thereby limiting their useful life, and must be mass-written to re-program.

Therefore a need exists for a more robust circuit that can store data even if there is a loss of power. Specifically, one that is less prone to "writing fatigue", does not need to be mass-written to be re-programmed, and are fast in re-programming.

SUMMARY OF THE INVENTION

The invention generally related to registers or flip-flop circuits. More particularly, the present invention refers to the use of non-volatile ferromagnetic memory cell to store binary data in a register or flip-flop circuit.

It is an advantage of the invention to have a flip-flop with a ferromagnetic memory cell or bit to store data even when there is no power provided to the circuitry. Thus, saving power during operation of any associated circuitry, and ensuring that there is no loss of the data should there be a temporary power shut down.

Additionally, the ferromagnetic cells provide for indefinite number of switching actions on the data without degradation to the capacity to store data therein, or eliminating "write fatigue".

The invention provides a latching circuit, comprising an input line entering the latching circuit for receiving a signal, an output line, electrically coupled to the input line, for outputting the signal, and a ferromagnetic bit and sensor coupled between the input line and the output line, to store a form of the signal in the ferromagnetic bit even when power has been suspended to the latching circuit.

Additional features and advantages of the invention will be set forth in the detailed description which follows, taken in conjunction with the accompanying drawing, which together illustrate by way of example, the features of the invention.

DETAILED DESCRIPTION

Figure 1:
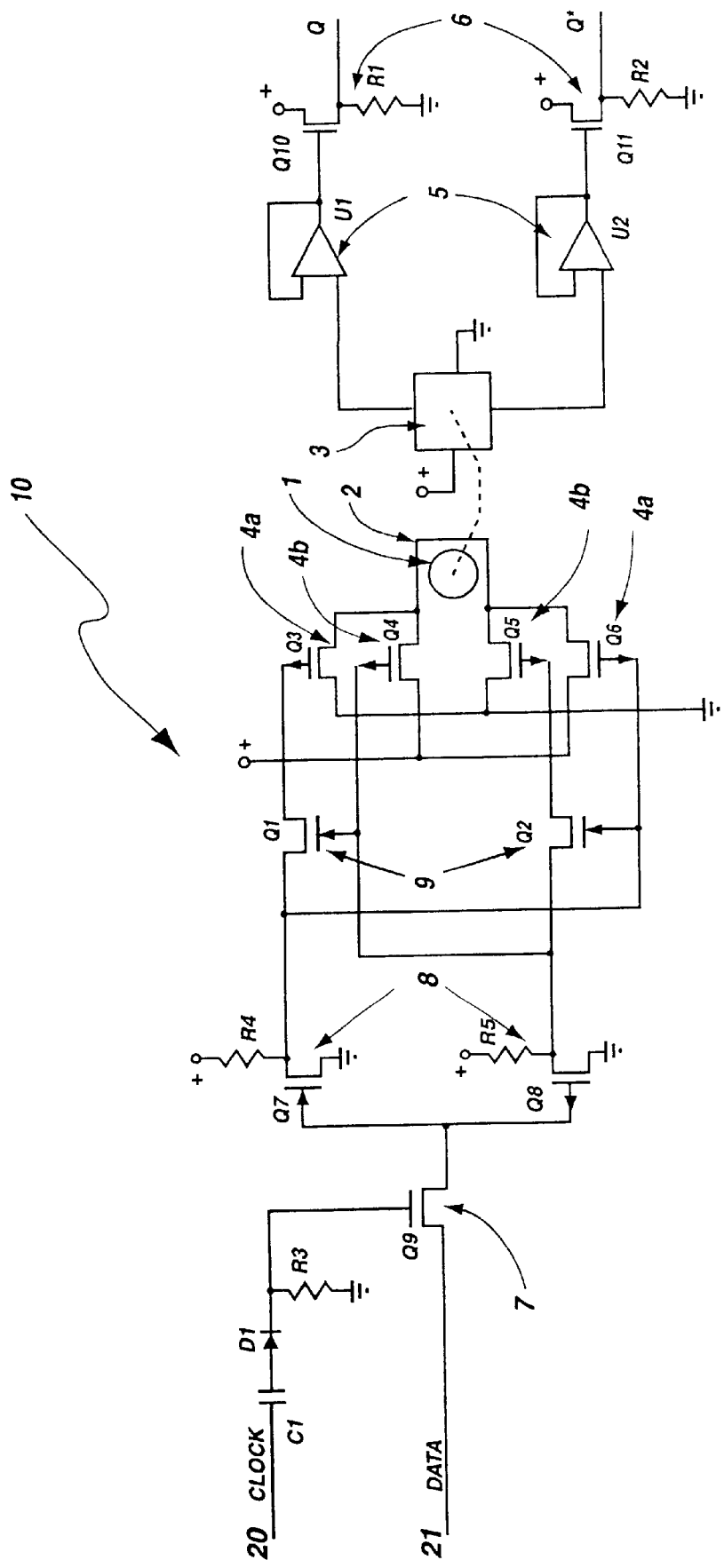
FIG. 1 is a schematic of a preferred embodiment of a in accordance with the present invention.

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

The following United States patents are herein incorporated by reference for their supporting teachings:

U.S. Pat. No. 5,324,998, is a zero power re-programmable flash cell for a programmable logic device.

U.S. Pat. No. 5,295,097, is a nonvolatile random access memory.

U.S. Pat. No. 5,867,049, is a zero setup time flip flop.

The invention may be used in the normal arena in which PALs are employed, but may be used in any situation where it may be advantageous to retain the last data stored after removal of power to the circuit as well as the simplicity of random re-programming and other areas as one skilled in the art will realize after understanding the scope of the invention. This flip-flop circuit could be in all manner of digital circuitry, including computers, robotics, telephones, automotive circuits, security devices, and so on. The advantages over prior art lie principally in that flip-flop devices uses ferromagnetic digital memory cells enabling non-volatility, high-speed in situ randomly re-programmability and indefinite long life span switching.

A flip-flop having product registers (flip flops) that use non-volatile ferromagnetic memory/storage cells for product storage registers is described wherein the non-volatile ferromagnetic memory cells, comprised of single stick-like ferromagnets whose aspect ratio is greater than 1:1 (height to width, e.g. 2:1 etc.), are fabricated normal to the plane of the substrate with a sensor centered intimate to, and at one end of the ferromagnets are used for these functions. The magnetic polarity of each ferromagnetic memory cell bit is coerced into reversal using write, or state change circuitry, comprised of a coil which surrounds, up to and including 270°, and is intimate to, the ferromagnetic stick. The write current in each coil is bi-directional, depending on the desired magnetic movement, or polarity, of the bit. The output of the sensor reflects the binary condition of the bit, and is used as binary data output for product registers.

FIG. 1 is a schematic of a dual output storage register 10, or DQQbar flip-flop (where Qbar is written as Q*), which is comprised of a ferromagnetic memory cell consisting of micron or sub-micron-sized ferromagnetic bit whose aspect ratio is greater than 1:1 (i.e., 5:1, etc.), deposited normal to the plane of the substrate with its attendant support circuitry. Uniquely, there is a ferromagnetic stick (bit) 1, which is at least partially, but not necessarily completely, surrounded by a write drive coil 2. The bi-directional current in the write drive coil sets the polarity of the bit and is switched by two sets of transistor pairs, or switches. The first transistor pair being Q3 and Q6, having reference number 4a, and the second pair being Q4 and Q5, having reference number 4b. These switches are in turn gated by Q1 and Q2, having reference number 9. With a signal on the DATA line 21 and a positive-going pulse on the CLOCK line 20, either Q7 or Q8 will be activated to allow the memory cell 1 to be set to one binary position or another. Other features of the drawing are: capacitor C1, diode D1, resistors R1, R2, R3 that are tied to ground, and R4 and R5 that are both tied to power +.

Figure 2:
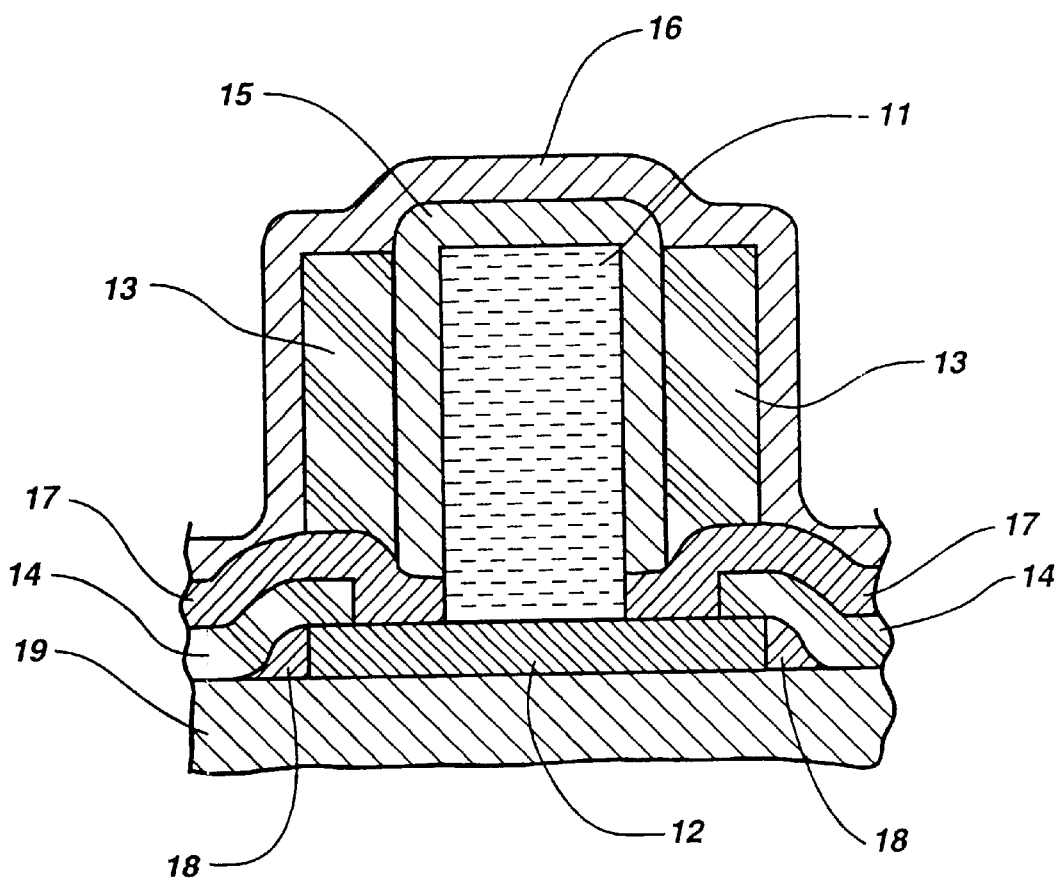
FIG. 2 is a cross sectional view of a single ferromagnetic memory bit.

On a second portion of the flip-flop 10, or storage register circuit, there is a ferromagnetic bit field sensor 3, which is capable of sensing remnant polarity stored in the bit 1. It is noted that the dashed line is meant to illustrate the fact that the sensor 3 is to be physically located proximate the top or bottom of the ferromagnetic bit 1, but is illustrated at a spaced relationship for schematic purposes only and not meant to illustrate physical layout as is shown in FIG. 2. Additionally, amplifiers U1 and U2, having reference number 5, respond based on the Hall voltage that appears across the sensor 3. The outputs are fed to the transistors Q10 and Q11, reference number 6, whose outputs, in turn, are "Q" and "Q*". In summary, a DATA signal is set into the cell 1 with the rising CLOCK line 20 and is permanently stored in the ferromagnetic memory bit 1 despite any power shutdown after being stored. Thereafter, the output in this case employs two operational amplifiers whose differential outputs are fed to both Q and Q*.

Since the ferromagnetic bit does not change state when power to the circuit is off, when power has thereafter been restored subsequent to a power off, the storage registers will have retained their critical data because of the nature of remnant magnetic power. Additionally, it is noted that additional power is not required to maintain the stored state in the flip-flop 10, thus, saving overall power consumption during the operation of the circuit over long periods of time.

FIG. 2 depicts, for example, a potential cross-section of a micron or sub-micron scale ferromagnetic memory cell with the sensor shown on the bottom. There is a ferromagnetic storage element 11, or "bit," a sensor 12, a sample drive line 14, which is made of Al, Cu or any other suitable conductor material. Additionally there is a cutaway of the set (write) drive coil 13 that wraps around bit 11. In this depiction, matrix interconnects are not shown for the sake of clarity. The entire memory cell rests on substrate 19, which can be silicon, glass, GaAs, or other suitable material. Insulation layer 15 resides between the ferromagnetic bit 11 and the set coil 13. Material layer 15 can be of a material such as $SiO_2$ or $Si_3N_4$, etc. There is an overall insulation sections 16, 17 and 18, again made of $SiO_2$, $Si_3N_4$, or other suitable material.

Several methods may be employed to make this cell, including, but not limited to, electroplating, sputtering, E-beam deposition, chemical vapor deposition and molecular beam epitaxy.

It is noted that, although a DQQ* latch is disclosed should be well understood by those skilled in the electrical arts that many types of latches exist, and that this invention is limited to the one disclosed. For example, there are SET and RESET latches, and DQ latches.

It is understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims.

What is claimed is:

1. A latching circuit, comprising:
    a) an input line entering the latching circuit for receiving a signal;
    b) an output line, electrically coupled to the input line, for outputting the signal; and
    c) a ferromagnetic bit and sensor coupled between the input line and the output line, to store a form of the signal in the ferromagnetic bit even when power has been suspended to the latching circuit.

2. The latching circuit of claim 1, wherein the latching circuit is a DQ register that contains the ferromagnetic bit.

3. The latching circuit of claim 1, wherein the latching circuit is a DQQ bar register that contains the ferromagnetic bit.

4. The latching circuit of claim 1, wherein the latching circuit is a SET and RESET register that contains the ferromagnetic bit.

5. The integrated circuit of claim 1, further includes a drive coil, which at least partially surrounds the ferromagnetic bit.

6. The integrated circuit of claim 5, wherein drive coils has a bi-directional current that sets the polarity of the ferromagnetic bit.

7. The latching circuit of claim 6, wherein the bidirectional current is switched by two sets of transistor pairs.

8. The latching circuit of claim 7, wherein the two sets of transistor pairs are in turn gated by first and second transistor respectively.

9. A flip-flop circuit, comprising:
    a) an input line entering the flip-flop circuit for receiving a signal;
    b) an output line, electrically coupled to the input line, for outputting the signal; and
    c) a ferromagnetic bit and sensor coupled between the input line and the output line, to store a form of the signal in the ferromagnetic bit even when power has been suspended to the flip-flop circuit.

10. The flip-flop circuit of claim 9, further includes a drive coil, which at least partially surrounds the ferromagnetic bit.

11. The flip-flop circuit of claim 9, wherein the flip-flop circuit is a SET and RESET register that contains the ferromagnetic bit.

12. The flip-flop circuit of claim 9, wherein the flip-flop circuit is a DQQ bar register that contains the ferromagnetic bit.

13. The flip-flop circuit of claim 9, wherein the flip-flop circuit is a DQ register that contains the ferromagnetic bit.

14. The flip-flop circuit of claim 13, wherein drive coils have a bi-directional current that sets the polarity of the ferromagnetic bit.

15. The flip-flop circuit of claim 14, wherein the bidirectional current is switched by two sets of transistor pairs.

16. The flip-flop circuit of claim 15, wherein the two sets of transistor pairs are in turn gated by first and second transistor respectively.

* * * * *